United States Patent
Dietz et al.

(10) Patent No.: US 7,692,426 B2
(45) Date of Patent: Apr. 6, 2010

(54) MAGNETIC RESONANCE APPARATUS WITH A SUPERCONDUCTING BASIC FIELD MAGNET WITH AN ELECTRICALLY CONDUCTIVE COATING ON THE OUTER VACUUM CHAMBER

(75) Inventors: Peter Dietz, Fürth (DE); Andreas Krug, Fürth (DE); Mark James Le Feuvre, Littlemore (GB); Annette Lohfink, Erlangen (DE); Thorsten Speckner, Marloffstein (DE)

(73) Assignee: Siemens Aktiengesellschaft, Munich (DE)

( * ) Notice: Subject to any disclaimer, the term of this patent is extended or adjusted under 35 U.S.C. 154(b) by 85 days.

(21) Appl. No.: 12/034,747

(22) Filed: Feb. 21, 2008

(65) Prior Publication Data
US 2008/0265888 A1 Oct. 30, 2008

(30) Foreign Application Priority Data
Feb. 21, 2007 (DE) .................. 10 2007 008 515

(51) Int. Cl.
*G01V 3/00* (2006.01)

(52) U.S. Cl. .................. 324/318; 324/319; 324/320

(58) Field of Classification Search .................. 324/318, 324/319, 320
See application file for complete search history.

(56) References Cited

U.S. PATENT DOCUMENTS

| | | | | |
|---|---|---|---|---|
| 5,289,128 A | * | 2/1994 | DeMeester et al. | 324/318 |
| 6,326,788 B1 | * | 12/2001 | Mulder et al. | 324/318 |
| 6,707,302 B2 | | 3/2004 | Ries | |
| 6,831,461 B2 | | 12/2004 | Arz et al. | |
| 6,844,733 B2 | * | 1/2005 | Heid | 324/318 |
| 2008/0157771 A1 | * | 7/2008 | Westphal | 324/319 |

* cited by examiner

*Primary Examiner*—Louis M Arana
(74) *Attorney, Agent, or Firm*—Schiff Hardin LLP

(57) ABSTRACT

In an arrangement with a basic field magnet and with a gradient coil of a magnetic resonance apparatus, the basic field magnet includes superconducting coils that are arranged in a reservoir with liquid helium for cooling. The helium reservoir is surrounded by a further reservoir, designated as an outer vacuum chamber. A vacuum exists between the outer vacuum chamber and the helium reservoir. A cryoshield is arranged between the outer vacuum chamber and the helium reservoir. The gradient coil is arranged in the inner chamber of the basic field magnet. The outer vacuum chamber has an additional coating with a high electrical conductivity.

9 Claims, 3 Drawing Sheets

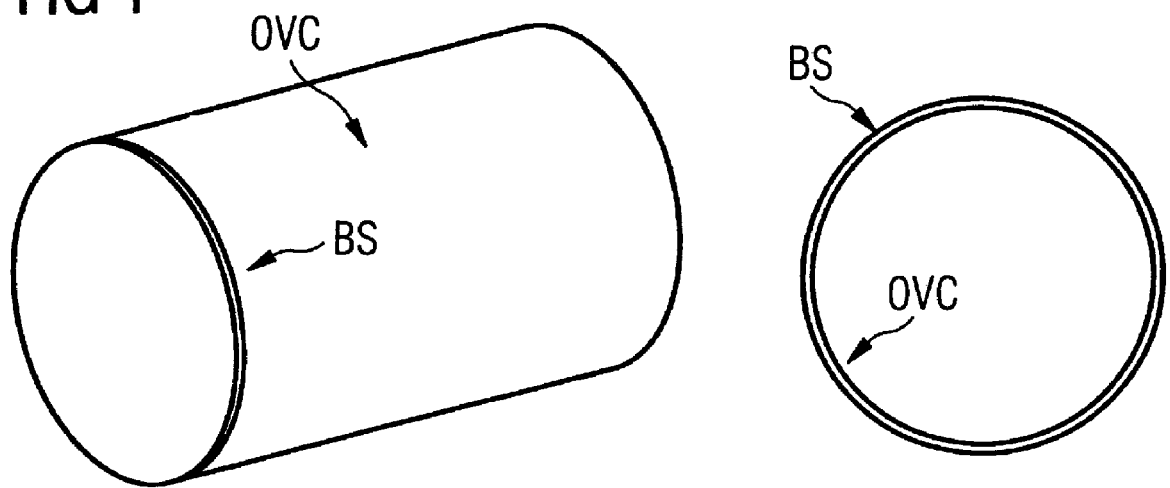
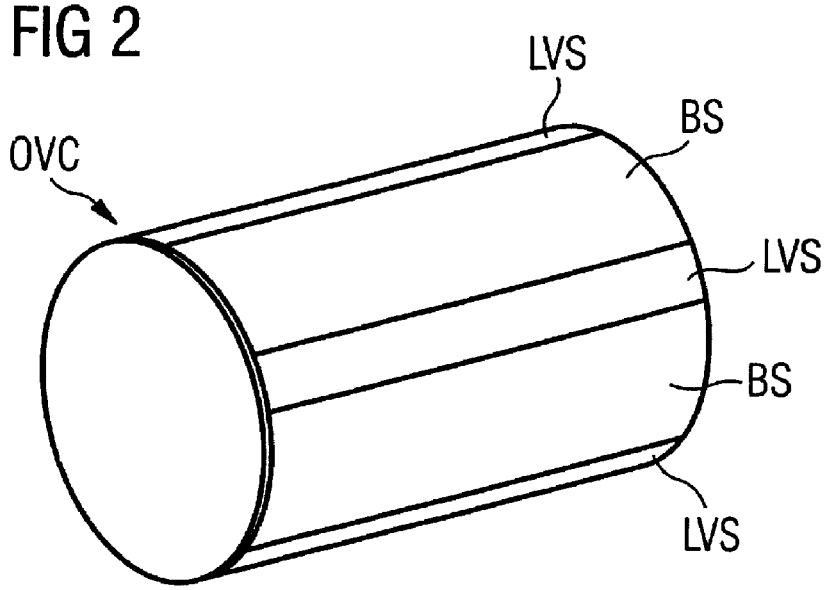

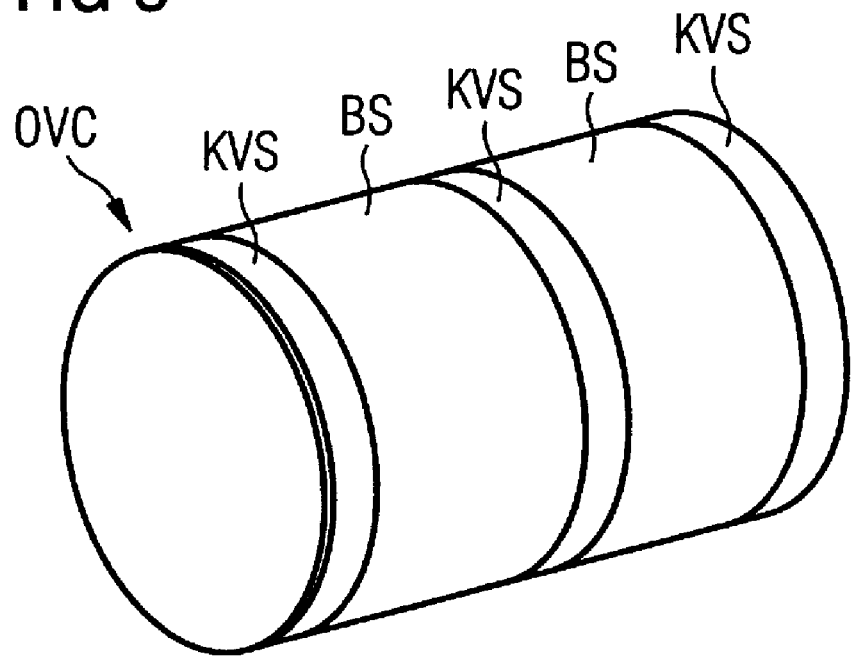
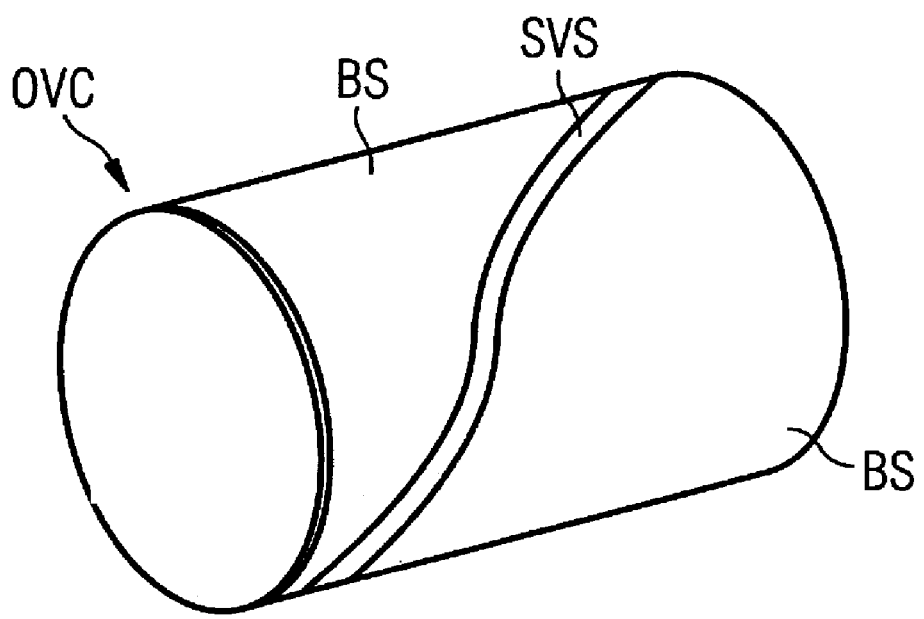

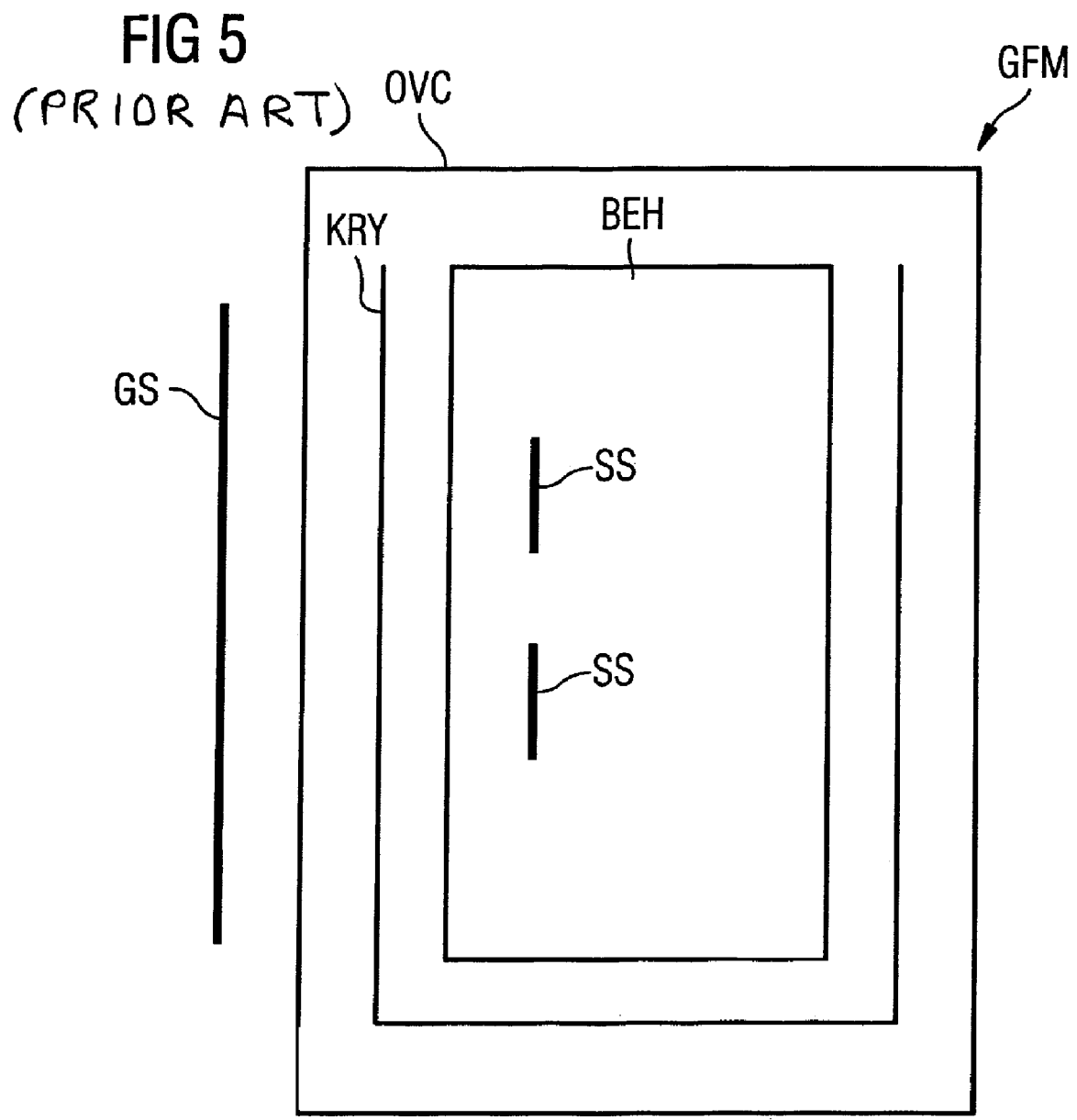

MAGNETIC RESONANCE APPARATUS WITH A SUPERCONDUCTING BASIC FIELD MAGNET WITH AN ELECTRICALLY CONDUCTIVE COATING ON THE OUTER VACUUM CHAMBER

BACKGROUND OF THE INVENTION

1. Field of the Invention

The present invention concerns an arrangement a basic field magnet and a gradient coil of a magnetic resonance apparatus of the type wherein the basic field magnet is a superconducting magnet having a cryoshield.

2. Description of the Prior Art

In magnetic resonance apparatuses a measurement subject is exposed to a strong, constant magnetic field in order to achieve an alignment of the nuclear spins of the atoms in the measurement subject. Ordered or aligned nuclear spins can be excited to an oscillation (resonance frequency) by radiated radio-frequency energy. A radio-frequency response signal, which is acquired with an acquisition coil for later analysis, is excited via the oscillation.

Exact information about the respective origination location (spatial information) of the RF response signals is a mandatory requirement for the image reconstruction. This spatial information is produced by magnetic fields (magnetic gradient fields) along the three spatial directions in addition to the static magnetic field. The gradient fields are lower in magnitude in comparison to the main field and are formed by gradient coils.

Gradient coils for magnetic resonance apparatuses essentially include three-axis magnetic field coils. Typically a pulse-shaped current on the order of several hundreds of amperes (at electrical voltages of 2 kV) flows through each gradient coil. Due to the ohmic resistance of the coil, a considerable amount of energy is converted into heat that must be dissipated to avoid an overly severe heating of the gradient coil and of the inner chamber of the magnetic resonance apparatus in which the patient lies.

FIG. 5 shows the basic design of a central part of a typical magnetic resonance apparatus.

A basic field magnet GFM of the magnetic resonance apparatus includes primary and secondary superconducting coils SS that are arranged for cooling in a sealed reservoir BEH with liquid helium.

The helium reservoir BEH is surrounded by a further reservoir that, for example, is shaped like a kettle and is, for example, produced from stainless steel. This kettle-shaped reservoir is known as an "outer vacuum chamber" (OVC).

Vacuum predominates between the outer vacuum chamber OVC and the helium reservoir BEH. Cryoshield KRY is additionally arranged between the outer vacuum chamber OVC and the helium reservoir BEH.

In the case of an outer vacuum chamber OVC formed of electrically-conductive material, effects of gradient coil scatter fields on the cryoshield KRY are reduced due to the conductivity.

A cylindrical gradient coil GS is fixed concentrically in the inner chamber of the basic field magnet GFM by supporting elements, with the gradient coil GS being attached on a supporting tube.

In the gradient coil current rise rates on the order of 2500 kA/s are achieved by switching of currents in the gradient coil or in the gradient system.

Due to the switching, Lorentz forces that generate strong mechanical oscillations occur by interaction with the strong magnetic field of the basic field magnet. All system components coupled to the gradient system (such as, for example, housing, coverings, parts of the basic field magnet, etc.) are thereby excited to oscillate (vibrate).

Eddy currents are likewise generated by the pulsed fields of the gradient coil in conductor structures that surround the gradient coil. Due to interaction with the basic magnetic field, these eddy currents excite forces that act on the structures and likewise cause these structures to oscillate (vibrate).

Due to the oscillations, in operation of the magnetic resonance apparatus a strong airborne sound is generated that, as noise, disturbs the patient, the operating personnel and other people in proximity to the system.

Moreover, due to the vibrations of the gradient coil and of the basic field magnet as well as the transfer of the vibrations to RF acquisition antenna and patient bed, images of insufficient clinical (diagnostic) quality are obtained, that exhibit "ghosting".

An artifact known as "Epi N/2 Ghosting" occurs when forces and therewith movements in highly conductive layers are caused by magnetic fields, for example in the cryoshield. KRY Secondary eddy currents, whose field effect disrupts the imaging and that also lead to helium volatilization arise due to this movement. This is known as "helium boil-off", namely the liquid helium is elevated in temperature and vaporized by ohmic heating. Due to the volatilization it is necessary to refill a corresponding quantity of liquid helium at high cost.

SUMMARY OF THE INVENTION

An object of the present invention to provide a cost-effective arrangement that is improved with regard to the "helium boil-off" and the "Epi N/2 ghost intensity" problems.

The inventive arrangement has a basic field magnet and gradient coil of a magnetic resonance apparatus. The basic field magnet includes superconducting coils that are arranged for cooling in a reservoir with liquid helium. The helium reservoir is surrounded by a further reservoir designated as an outer vacuum chamber.

A vacuum exists between the outer vacuum chamber and the helium reservoir. A cryoshield is arranged between the outer vacuum chamber and the helium reservoir. The gradient coil is arranged in the inner chamber of the basic field magnet. The outer vacuum chamber has a coating with a high electrical conductivity.

The electrical conductivity is preferably greater than the electrical conductivity of steel or stainless steel.

The present invention is based on the recognition that both the helium vaporization and the "Epi N/2 ghosting" are based on the same origin of energy transfers: both movements of the gradient coil and scatter fields of the gradient coil exert a large influence on the "ghosting" and on the helium vaporization.

The scatter fields of the gradient coil penetrate the outer vacuum chamber OVC formed of steel and reach the cryoshield. Movements of the cryoshield are caused by eddy currents so that ultimately the helium vaporization and the "Epi N/2 ghosting" are caused.

The inventive arrangement causes the scatter fields of the gradient coil not to reach the cryoshield. For this purpose the outer vacuum chamber, OVC has an additional coating with a high conductivity. In a preferred embodiment this coating is copper.

Due to the skin effect this coating is sufficient to prevent scatter fields of the gradient coil from reaching the actual outer vacuum chamber OVC, by the scatter fields already being dissipated beforehand or being absorbed after penetrating the outer vacuum chamber OVC before reaching the cryoshield.

In a preferred development, the outer vacuum chamber OVC is additionally reinforced in terms its shape in order to additionally reduce secondary scatter fields that are generated by vibrations.

For example, the previously employed simple cylinder shape of the outer vacuum chamber OVC is provided with reinforcement struts or reinforcement rings.

As an alternative to this it is also possible to fashion the outer vacuum chamber OVC (which is designed, for example, in the shape of a cylinder) in a stable multi-layer design, with one layer exhibiting the aforementioned high conductivity. This is advantageously the outermost layer.

Due to the inventive embodiment and corresponding material selection, eigenfrequencies of the outer vacuum chamber OVC do not coincide with eigenfrequencies of the cryoshield.

BRIEF DESCRIPTION OF THE DRAWINGS

FIG. 1 illustrates an inventively designed outer vacuum chamber OVC with an additional coating, FIG. 2 illustrates an embodiment of the outer vacuum chamber OVC with a coating and longitudinal bracing.

FIG. 3 illustrates an embodiment of the outer vacuum chamber OVC with a coating and transverse bracing.

FIG. 4 illustrates an embodiment of the outer vacuum chamber OVC with a coating and helical bracing.

FIG. 5, as noted above illustrates the basic design of a magnetic resonance apparatus according to the prior art.

DESCRIPTION OF THE PREFERRED EMBODIMENTS

FIG. 1 shows an inventively designed, cylindrical outer vacuum chamber OVC with a coating BS.

The coating BS is applied on the surface of the outer vacuum chamber OVC galvanically or by adhesive bonding. The coating BS exhibits a high electrical conductivity and is produced, for example, from aluminum or preferably from copper if the outer vacuum chamber OVC is produced from steel.

The coating BS is grounded or connected with an equalization potential for dissipation.

FIG. 2 shows an embodiment of the outer vacuum chamber OVC from FIG. 1 with the coating BS and with linearly designed longitudinal braces LVS.

The longitudinal braces LVS are circumferentially arranged around the cylinder and, for example, run parallel to the longitudinal axis of symmetry of the cylindrical outer vacuum chamber OVC.

FIG. 3 shows another embodiment of the outer vacuum chamber OVC with the coating BS and with circular circumferential transverse braces KVS.

The circular transverse braces KVS are uniformly distributed as rings over the length of the cylindrical outer vacuum chamber OVC.

FIG. 4 shows another embodiment of the outer vacuum chamber OVC with the coating BS and with a bracing SVS proceeding helically circumferentially around the cylindrical outer vacuum chamber OVC.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance apparatus comprising:
    a basic field magnet that generates a basic magnetic field in an examination volume, said basic field magnet comprising superconducting coils contained in a helium reservoir cooled with liquid helium, an outer vacuum chamber forming a further reservoir surrounding said helium reservoir with a vacuum between said outer vacuum chamber and said helium reservoir, and a cryoshield between the outer vacuum chamber and the helium reservoir, said basic field magnet defining an inner chamber in which said examination volume is located, said outer vacuum chamber having an outer vacuum chamber exterior surface;
    a gradient coil located in said inner chamber of said basic field magnet, said gradient coil generating a gradient magnetic field in said examination volume resulting in generation of scatter fields that elevate a temperature of said liquid helium in said helium reservoir; and
    said outer vacuum chamber comprising a coating applied directly to said outer vacuum chamber exterior surface with no gap between said coating and said outer vacuum chamber exterior surface, said coating having a high electrical conductivity greater than an electrical conductivity of steel or stainless steel that counteracts elevation of said temperature of said liquid helium in said helium reservoir.

2. An arrangement as claimed in claim 1 wherein said coating is attached in an electrically-conductive manner with said outer vacuum chamber.

3. An arrangement as claimed in claim 1 wherein said coating is bonded to said outer vacuum chamber by an application technique selected from the group consisting of galvanic application and adhesive bonding.

4. An arrangement as claimed in claim 1 wherein said coating is selected from the group consisting of copper and aluminum.

5. An arrangement as claimed in claim 1 wherein said coating is connected in an electrically conductive manner with an equalization potential.

6. An arrangement as claimed in claim 1 wherein said outer vacuum chamber comprises a structural reinforcement that counteracts vibrations of said outer vacuum chamber.

7. An arrangement as claimed in claim 6 wherein said structural reinforcement is a structure selected from the group consisting of reinforcement struts and reinforcement rings.

8. An arrangement as claimed in claim 6 wherein said structural reinforcement at least partially covers said coating.

9. An arrangement as claimed in claim 6 wherein said outer vacuum chamber has a chamber wall comprised of multiple layers forming said structural reinforcement.

* * * * *